United States Patent
Solomon et al.

(10) Patent No.: US 6,569,765 B1
(45) Date of Patent: May 27, 2003

(54) HYBRID DEPOSITION SYSTEM AND METHODS

(75) Inventors: Glenn S. Solomon, Redwood City, CA (US); David J. Miller, San Francisco, CA (US)

(73) Assignee: CBL Technologies, Inc, Redwood City, CA (US)

( * ) Notice: Subject to any disclaimer, the term of this patent is extended or adjusted under 35 U.S.C. 154(b) by 0 days.

(21) Appl. No.: 09/384,040

(22) Filed: Aug. 26, 1999

(51) Int. Cl.$^7$ ............................................... H01L 21/44
(52) U.S. Cl. ..................... 438/680; 438/681; 438/694; 438/715; 438/712; 438/46; 257/615; 257/190
(58) Field of Search ................................. 438/694, 715, 438/717, 46, 680, 681; 257/615, 190

(56) References Cited

U.S. PATENT DOCUMENTS

| | | | | |
|---|---|---|---|---|
| 4,404,265 A | * | 9/1983 | Manasevit ................... 428/689 |
| 4,533,410 A | * | 8/1985 | Ogura et al. ................. 148/175 |
| 4,988,640 A | * | 1/1991 | Bohling et al. ............... 437/81 |
| 5,227,328 A | * | 7/1993 | Khan et al. ................... 437/82 |
| 5,273,931 A | * | 12/1993 | Taskar et al. ................. 437/108 |
| 5,468,678 A | * | 11/1995 | Nakamura et al. ........... 437/107 |
| 5,587,014 A | * | 12/1996 | Iyechika et al. .............. 117/90 |
| 5,814,239 A | * | 9/1998 | Kaneko et al. ............... 216/63 |
| 5,891,790 A | * | 4/1999 | Keller et al. ................. 438/508 |
| 5,993,542 A | * | 11/1999 | Yanashita et al. ............ 117/84 |
| 6,110,531 A | * | 8/2000 | Paz de Araujo et al. ...... 427/255.25 |
| 6,177,292 B1 | * | 1/2001 | Hong et al. ................... 438/46 |
| 6,218,280 B1 | * | 4/2001 | Kryliouk et al. ............. 438/607 |

* cited by examiner

Primary Examiner—Matthew Smith
Assistant Examiner—V Yevsikov
(74) Attorney, Agent, or Firm—JOI Patent; Joshua D. Isenberg

(57) ABSTRACT

A hybrid deposition system includes a reactor chamber, at least one heating unit, a first reagent gas source, a metallo-organic source, a second reagent gas source, and a valve unit for stopping flow of gas from the metallo-organic source. The hybrid incorporates features of both metal-organic chemical vapor deposition (MOCVD) and hydride vapor-phase epitaxy (HVPE). The hybrid system may be operated in MOCVD mode, in HVPE mode, or in both MOCVD and HVPE mode simultaneously. The system may be switched between deposition modes without interrupting deposition, or removing the sample from the reactor chamber. The at least one heating unit may be moved relative to the reactor chamber, or vice versa, for easily and rapidly adjusting the temperature of the reactor chamber. A method for forming at least one epitaxial layer of a III–V compound on a non-native substrate in which deposition is performed by two different techniques in the same reactor chamber. The two different deposition techniques, for example, MOCVD and HVPE, may be performed in the same reactor chamber, consecutively and concurrently.

41 Claims, 8 Drawing Sheets

HYBRID DEPOSITION SYSTEM AND METHODS

FIELD OF INVENTION

The present invention relates to a hybrid deposition system. The invention further relates to a deposition system, which combines features of metal-organic chemical vapor deposition with hydride vapor-phase epitaxy. The present invention also relates to a method of forming semiconductor heterostructures, by two different deposition techniques, in a single reactor.

BACKGROUND

Hydride vapor-phase epitaxy (HVPE) is an important technique for the epitaxial growth of various semiconductors, such as gallium nitride. Gallium nitride (GaN) is emerging as an important technological material.

For example, GaN is currently used in the manufacture of blue light emitting diodes, semiconductor lasers, and other opto-electronic devices. The background of the related art will be discussed with particular reference to the deposition of GaN.

HVPE is a currently favored technique for GaN deposition, because it provides relatively rapid growth in a cost-effective manner. In this technique, growth of GaN proceeds due to the high temperature, vapor-phase reaction between gallium chloride (GaCl) and ammonia ($NH_3$). The ammonia is supplied from a standard gas source, while the GaCl is produced by passing HCl over a heated liquid gallium supply. The two gases (ammonia and GaCl) are directed towards a heated substrate where they react to produce solid GaN on the substrate surface.

While HVPE allows for high growth rates of GaN, there are certain difficulties associated with HVPE as a technique for growing other III–V nitrides or GaN alloys. For example, it is difficult to grow materials such as aluminum nitride (AlN) or alloys of AlN and GaN (AlGaN) by HVPE. The problem lies in providing an adequate supply of aluminum chloride. The latter substance is extremely stable, and tends to form a solid with low vapor pressure even at the elevated temperature of a HVPE reactor. Thus, when HCl is passed over Al metal, the aluminum chloride that is formed tends to solidify and not to be carried towards the substrate.

A technique for growing both AlN and GaN layers on the same sample is desirable for several applications. For example, a buffer layer of AlN or AlGaN grown between an epitaxial GaN layer and a typical substrate such as sapphire ($Al_2O_3$) improves the quality of the GaN epitaxial layer. This improved quality results from closer matching of lattice constant and thermal expansion coefficient between the buffer layer and the GaN. In addition, it is often desirable to form heterostructures in which layers of AlN, GaN, and AlGaN, are grown on top of one another. Heterostructures find many applications in semiconductor lasers, light-emitting diodes (LED's), high-electron mobility transistors, and other electronic and opto-electronic devices.

Similarly, it is also desirable to grow heterostructures including indium nitride (InN) and associated alloys (InGaN, InAlN, InAlGaN), in the same system. The use of InN increases the range of heterostructures that can be grown, leading to many new device applications. However, growth of InN by HVPE may present problems. For example, thin consistent layers of InGaN are difficult to fabricate using the high growth rates typically associated with HVPE techniques. Furthermore, for most device applications, it is necessary to selectively incorporate dopants to provide conductive materials. Junctions of material incorporating different dopant types are key elements of almost all electronic devices, such as the diode, the transistor, and the semiconductor laser. However, some dopant materials are best utilized in organo-metallic form.

A further drawback to HVPE of prior art methods and systems is that certain substrates cannot be incorporated into an HVPE system until a certain amount of epitaxial material has been grown. For example, it may be desired to grow GaN or related materials on silicon (Si) substrates. Alternatively, it may be desired to use compound substrates (consisting of more than one type of material), or patterned substrates. If any of these substrates are subjected directly to HVPE growth, they may be destroyed. This is due to the presence in HVPE reactors of certain gases, such as HCl, which act as etchants on HVPE-sensitive substrates (e.g., Si). It would be advantageous to provide a system and method for growth of a protective layer of epitaxial material by a method such as metal-organic chemical vapor deposition (MOCVD) before beginning HVPE growth, in which both deposition techniques (MOCVD and HVPE) are performed in the same reactor.

The present invention provides hybrid deposition systems and methods that overcome many of the above-described problems inherent in prior art deposition of GaN and related materials.

SUMMARY OF THE INVENTION

In view of the above, it is an object of the present invention to provide a hybrid deposition system for the efficient growth of aluminum nitride, indium nitride, gallium nitride, metal alloy-nitrides and related materials. Methods of the invention allow the incorporation of complex dopants and complex dopant mixtures into epitaxial layers and provides for the production of a large variation of film thicknesses and growth rates. Furthermore, methods of the invention can accommodate many different substrate types. According to one embodiment, the invention combines features of metal-organic chemical vapor deposition (MOCVD) and HVPE into a single, highly versatile, hybrid deposition system.

In the MOCVD growth technique of the prior art, ammonia gas is reacted with a metallo-organic compound at high temperatures above or on the substrate, leading to deposition of a solid semiconductor material. The present invention uses metal-organic sources and a HVPE reagent delivery chamber (e.g., liquid gallium supply), in a hybrid reactor. The system of the invention can be switched between operation in MOCVD mode and-HVPE mode, or can be operated in combined MOCVD/HVPE mode. Such switching between modes is easily achieved by changing the nature of the source or reagent gases supplied to the reactor, and by any appropriate changes to the operating or growth temperature of the reactor.

Briefly, to operate the hybrid system of the invention in MOCVD mode, at least one metallo-organic and ammonia gas are supplied to the reactor. To switch the hybrid system to HVPE mode, the metallo-organic supply is shut off, and a supply of a second reagent gas (e.g., GaCl) is provided by passing HCl over liquid metal (Ga). Generally, but not invariably, the temperature of the reactor may be changed when switching between HVPE mode and MOCVD mode.

Because both growth methods (MOCVD and HVPE) are incorporated into a single reactor system, it is possible to switch between the two techniques without interrupting deposition on the substrate or removing the sample from the reactor. This feature also increases the efficiency and decreases the cost of the method of the invention. According to systems and methods of the invention, AlN and thin InN layers can be conveniently grown (by MOCVD) in the same reactor as is used for the growth of thick GaN (by HVPE). Similarly, AlN, InN, GaN, and their alloys can be grown in the same reactor by, MOCVD and HVPE, either consecutively or concurrently. Therefore, a diverse array of heterostructures of AlN, InN, GaN and their alloys can be grown quickly and inexpensively using systems and, methods of the invention.

According to one aspect of the invention, a method is provided for growing III–V nitride layers on a non-native substrate, using both HVPE and MOCVD growth techniques simultaneously. As an example of this situation, two different source gases, such as GaCl and an aluminum-containing metallo-organic, are both supplied to the system together with ammonia. In this example, each source gas reacts with the ammonia gas at the location of the substrate, leading to deposition of AlGaN. InGaN or InAlGaN may be grown by an analogous method by supplying the appropriate source gases. Furthermore, dopants may be incorporated in layers of GaN or its alloys grown using the hybrid deposition system of the invention.

According to another aspect of the invention, a method is provided for using HVPE-sensitive substrates for deposition of III–V compounds by HVPE. Substrates that would normally be destroyed by HVPE growth, such as Si substrates or patterned substrates, are stable under MOCVD growth. A first, protective layer of a III–V compound is first grown on the substrate by MOCVD in the hybrid reactor. The hybrid reactor may then be switched to operate in HVPE mode, and at least one additional layer is formed by HVPE on the first layer. HVPE has the advantage of having a faster growth rate and is less expensive than MOCVD.

One feature of the invention is that it provides a hybrid deposition system. Another feature of the invention is that it provides a deposition system that can be operated in two different modes. Another feature of the invention is that it provides a hybrid MOCVD/HVPE deposition system. Another feature of the invention is that it provides a deposition system including a reactor and a plurality of heating units for heating the reactor.

One advantage of the invention is that it provides a hybrid deposition system which can be switched between MOCVD mode and HVPE mode and thus reducing the potential of introducing contamination of the structures produced that occur when switching from one reactor to another. Another advantage of the invention is that it provides a method for forming first and second III–V nitride layers, in which the first layer is formed by MOCVD in a hybrid reactor, and the second layer is formed by HVPE in the same hybrid reactor. Another advantage of the invention is that it provides a method of forming a III–V nitride layer by simultaneous deposition by MOCVD and HVPE. Another advantage of the invention is that it provides a hybrid deposition system including a reactor that is moveable with respect to at least one heating unit.

Yet another advantage of the current invention is that a high quality device structure can be produced by first producing a thin buffer layer by MOCVD, a thicker GaN layer by HVPE on the thin buffer layer and a third nitride layer on the thicker GaN layer by MOCVD.

These and other objects, advantages and features are accomplished by the provision of a hybrid deposition system, including: a reactor; a reagent delivery chamber having a reagent delivery chamber inlet, the reagent delivery chamber coupled to the reactor; at least one heating unit for supplying heat to the reactor; and at least one metallo-organic source coupled to, the reactor.

These and other objects, advantages and features are accomplished by the provision of a method of forming a semiconductor layer, including the steps of: a) arranging a substrate within a reactor; b) heating the reactor to a first growth temperature; c) supplying a first reagent gas and an organo-metallic vapor to the reactor to provide, by MOCVD, a first III–V nitride layer on the substrate; d) after step c), stopping the supply of organo-metallic vapor to the reactor; and e) while continuing to supply the first reagent gas to the reactor, supplying a second reagent gas to the reactor to provide at least one additional III–V nitride layer on the first III–V nitride layer.

These and other objects, advantages and features are accomplished by the provision of a method of forming a semiconductor layer, comprising the steps of: a) arranging a substrate within a reactor; b) heating the reactor to a first growth temperature; c) supplying a first reagent gas to the reactor; d) supplying a metallo-organic vapor to the reactor to provide, by MOCVD, a first III–V nitride layer on the substrate; e) after step d), while continuing to supply the first reagent gas and the metallo-organic vapor to the reactor, supplying a second reagent gas to the reactor to provide at least one additional III–V nitride layer on the first III–V nitride layer.

These and other objects, advantages and features of the invention will be set forth in part in the description which follows and in part will become apparent to those having ordinary skill in the art upon examination of the following, or may be learned from practice of the invention. The advantages of the invention may be realized and attained as particularly pointed out in the appended claims.

DETAILED DESCRIPTION OF THE PERFERRED EMBODIMENTS

Figure 1:
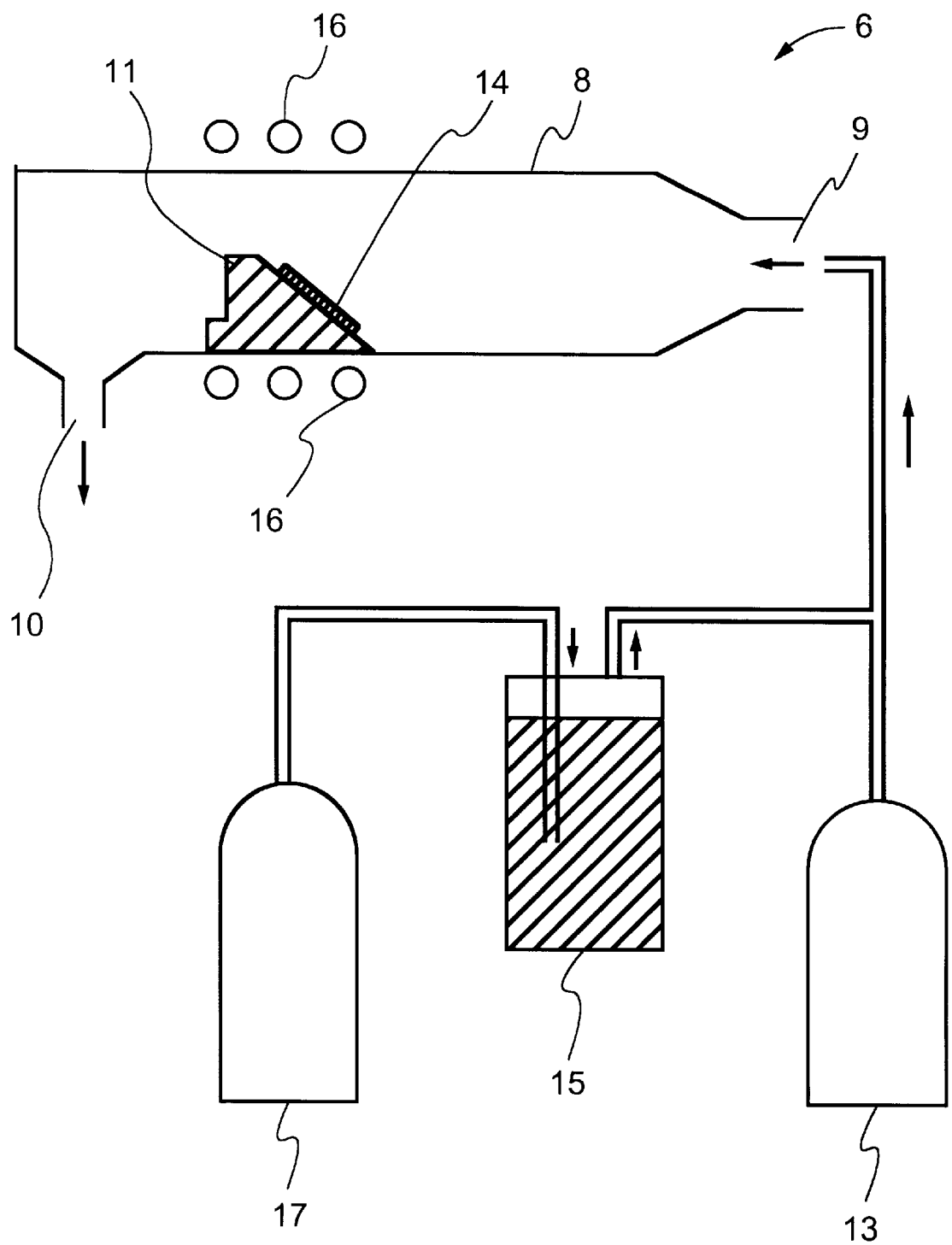
FIG. 1 schematically represents a MOCVD system of the prior art.

Referring to the drawings, FIG. 1 schematically represents a MOCVD system 6 according to the prior art. Briefly, system 6 includes a reactor 8, at least part of which is surrounded by a heating unit 16. A substrate 14, arranged within reactor 8, is heated by means of heating unit 16. Ammonia is provided from a standard gas source 13. Vapor of a metallo-organic compound is supplied by passing a carrier gas 17, typically nitrogen or hydrogen, through a liquid supply of the metallo-organic compound contained within a bubbler 15. The temperature of the metallo-organic compound supply is precisely controlled, and the flow of carrier gas 17 is regulated to provide a stream of gas that contains a known amount of vapor of the metallo-organic compound. The ammonia and the vapor of the metallo-organic compound are introduced into chamber 8. Deposition of InN, AlN GaN or alloy nitrides of In, Al, and Ga, occurs on the surface of substrate 14 due to the high temperature vapor-phase reaction of the metallo-organic compound with the ammonia gas. As an example, for the deposition of AlN the metallo-organic (or organo-metallic) compound in bubbler 15 is an aluminum-containing organo-metallic, while for the deposition of GaN the organo-metallic compound in bubbler 15 is a gallium-containing organo-metallic.

Figure 2:
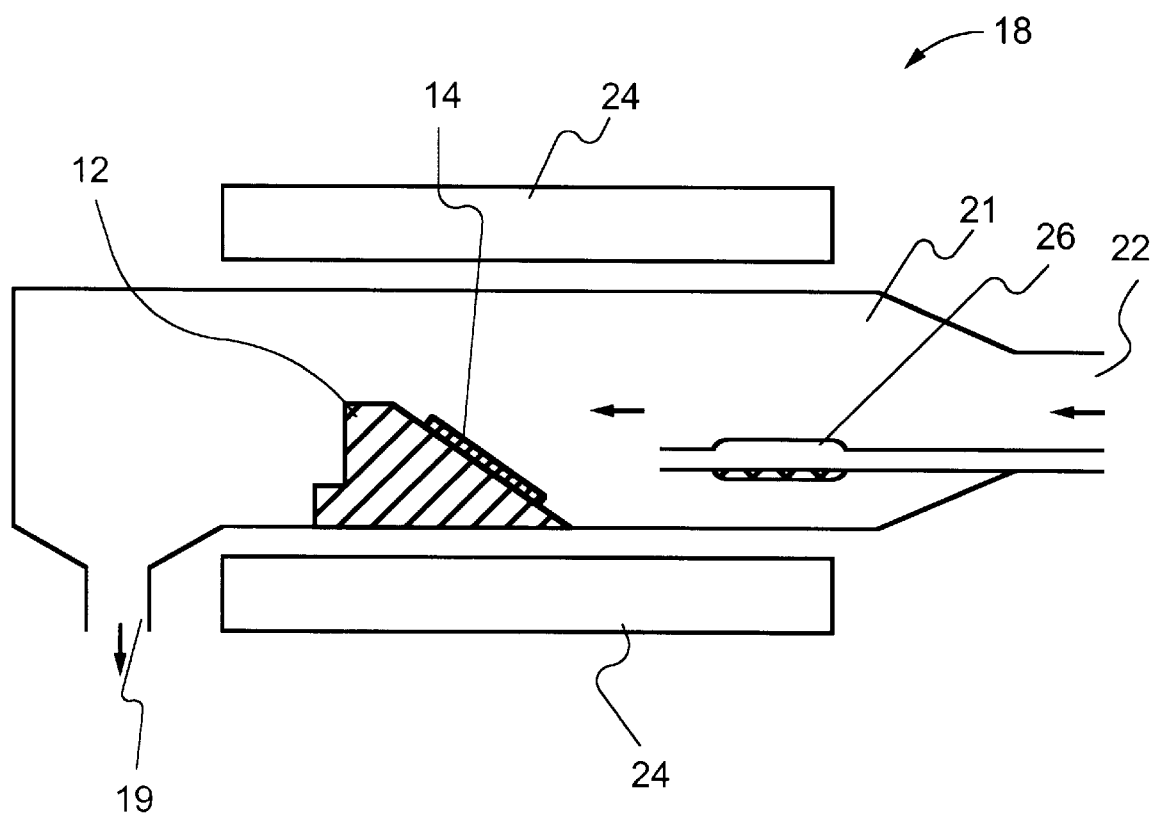
FIG. 2 schematically represents a HVPE system of the prior art.

FIG. 2 schematically represents an HVPE system 18 according to the prior art. Briefly, system 16 includes a growth tube or reactor 21 having inlet 22, and outlet 19, and a reagent delivery chamber or reaction assembly 26. System 18 may be contained entirely within a heat source, e.g., a furnace 24. Epitaxial deposition on heated substrate 14 disposed on a platform 12 proceeds by the vapor-phase reaction of source or reagent gases, which are introduced into reactor 21. For example a reagent gas, such as gallium chloride, indium chloride, or aluminum chloride, may be projected towards substrate 14 via reaction assembly 26; while ammonia may be introduced into growth tube 21 through reactor inlet 22. Reagent gas, e.g. GaCl, may be formed in reaction assembly 26 by passing HCl over liquid metal (e.g., gallium) at elevated temperatures. The direction of gas flow is indicated by the arrows. Reagent gases (e.g., GaCl, InCl, AlCl) react with ammonia within growth tube 21 to form the respective nitride, GaN, InN, or AlN, which is deposited on substrate 14.

Figure 3:
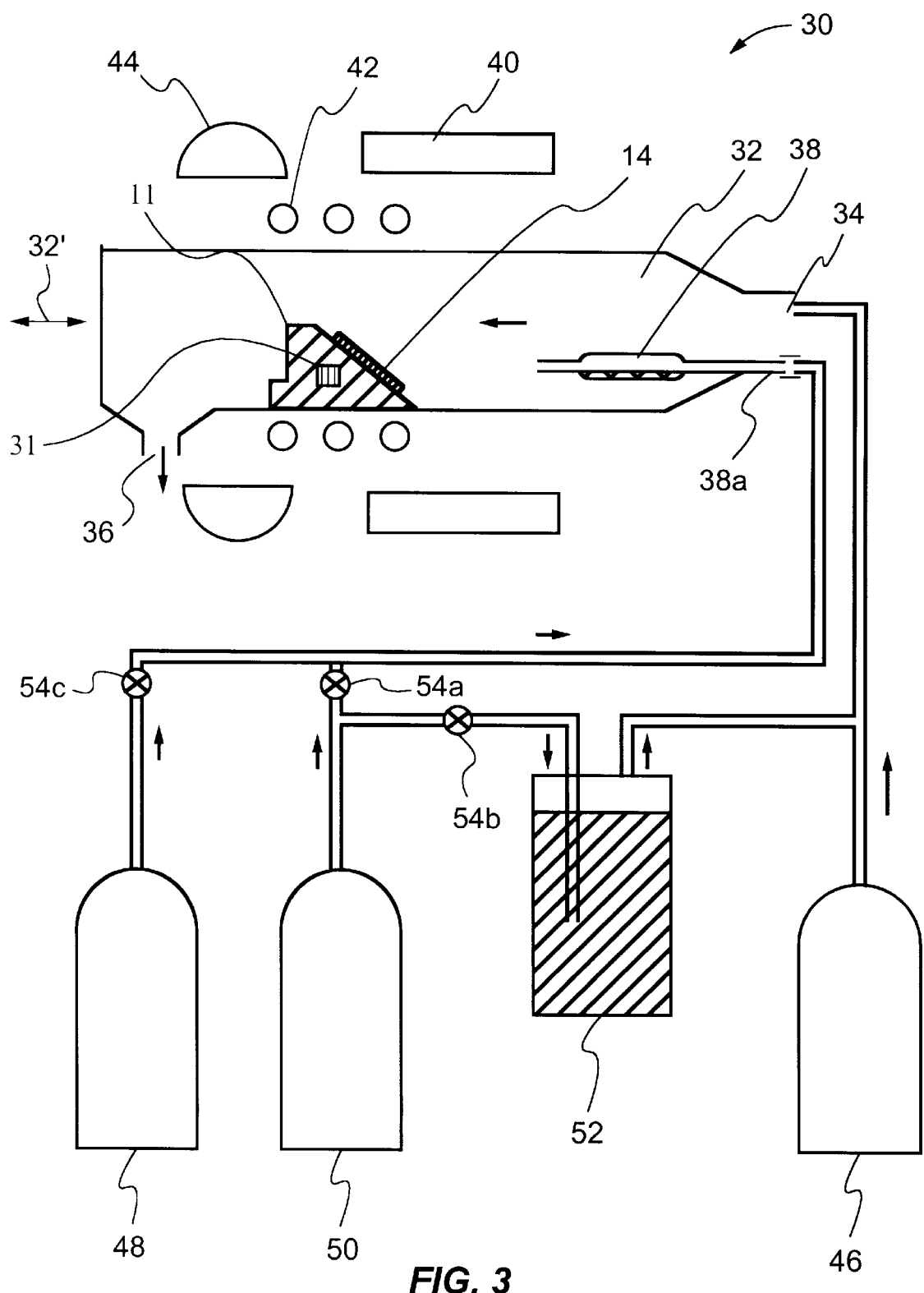
FIG. 3 schematically represent a hybrid deposition system, according to the invention.

FIG. 3 schematically represents a hybrid deposition system 30, according to one embodiment of the invention system 30 includes a reactor chamber 32 having an inlet 34 and an outlet 36, and a reagent delivery chamber 38 coupled to reactor chamber 32. Reactor inlet 34 is coupled to a first reagent gas source 46, and to at least one metallo-organic source 52. The direction of gas flow is indicated by the arrows. First reagent gas source 46 supplies a first reagent gas to reactor 32. The first reagent gas is preferably ammonia.

Metallo-organic source 52 contains a metallo-organic composition for supplying a metallo-organic vapor to reactor chamber 32. The metallo-organic composition is preferably an aluminum-, indium-, or gallium containing metallo-organic compound, or a mixture or alloy of at least two metallo-organic compounds having two different metals selected from Ga, In, and Al. Examples of metallo-organic compounds useful in the practice of the invention are: trimethylaluminum (TMA), triethyl-aluminum (TEA), trimethylindium (TMI), triethylindium (TEI), trimethylgallium (TMG), and triethylgallium (TEG). Herein, the terms organo-metallic and metallo-organic may be used interchangeably. Metallo-organic source 52 may be in the form of a bubbler, the latter well known in the art.

Reagent delivery chamber 38 is coupled to a precursor gas source 48 and to a carrier gas source 50. Precursor gas source 48 supplies precursor gas, preferably HCl, to reagent delivery chamber 38. Reagent delivery chamber 38 contains liquid metal such as Ga, In, Al, preferably Ga or In. A second reagent gas is generated within reagent delivery chamber 38 when HCl gas is passed over liquid metal within chamber 38. The second reagent gas passes from reagent delivery chamber 38 into reactor 32. Carrier gas source 50 supplies a carrier gas. Carrier gas source 50 is coupled both to reagent delivery chamber inlet 38a, and to metallo-organic source 52. Carrier gas from carrier gas source 50 serves to carry precursor gas from source 48 to inlet 38a of chamber 38. Carrier gas from carrier gas source 50 also supplies organo-metallic vapor from the metallo-organic composition contained within metallo-organic source 52.

Flow of carrier gas from carrier gas source 50 to inlet 38a of reagent delivery chamber 38 is controlled by a first valve unit 54a. Flow of carrier gas from carrier gas source 50 to the metallo-organic source 52 is controlled by a second valve unit 54b. First and second valve units 54a, 54b allow the control of carrier gas flow from source 50 to the reagent delivery chamber 38 and to metallo-organic source 52. A third valve unit 54c controls flow of the precursor gas from source 48 to reagent delivery chamber 38. The deposition mode of system 30 can be determined and adjusted by means of first, second, and third valve units 54a–c. The, to operate system 30 solely in MOCVD mode, valve units 54a and 54c are closed, while valve unit 54b is opened. Carrier gas from source 50 carries metallo-organic vapor via source 52 to reactor 32, while source 46 suppl;ies first reagent gas (ammonia) to reactor 32. The temperature of reactor 32 and of substrate 14 is adjusted, for MOCVD deposition of a particular III–V compound or alloy, by means of heating units 31, 42, 44. Deposition on substrate 14 then proceeds solely by MOCVD.

The deposition mode of system 30 may be "switched" or changed from solely MOCVD mode to solely HVPE mode, without. interrupting deposition or removing the substrate from reactor 32, as follows. Valve unit 54b is closed, while valve units 54a and 54c are opened. Valve units 54a and 54c may be opened first, and thereafter valve unit 54b closed. Metallo-organic vapor is no longer supplied to reactor 32. Instead, precursor gas is supplied from source 48 to chamber 38, the latter in turn supplies the second reagent gas (e.g., GaCl, InCl) to reactor 32; while source 46 continues to supply first reagent gas (ammonia) to reactor 32. The temperature of reactor 32 and of substrate 14 may be adjusted, for HVPE deposition of a particular III–V compound or alloy, by means of heating units 40, 42, 44. Deposition on substrate 14 then proceeds solely by HVPE. The precise timing of opening and closing of valve units 54a–c is, at least to some extent, a matter of design choice.

The deposition mode of system 30 may also be switched from solely MOCVD or solely HVPE mode, to a combined MOCVD/HVPE mode. MOCVD/HVPE mode is characterized by simultaneous deposition by MOCVD and HVPE. Changes between each of these modes may be performed without interrupting deposition, or removing the substrate from reactor 32. Thus, for the simultaneous deposition by MOCVD and HVPE of III–V compounds, or alloys thereof, each of valve units 54a, 54b, and 54c may be opened to an appropriate extent. In this case, ammonia is supplied to reactor 32 via source 46, metallo-organic vapor is supplied to reactor 32 via source 52, and at the same time the second reagent gas is supplied to reactor 32 from chamber 38. Deposition then proceeds by both MOCVD and HVPE to form a hybrid MOCVD/HVPE layer on the substrate or sample. The relative contribution of each deposition technique (MOCVD and HVPE) may be determined by adjustments to valve units 54a–c. The temperature of reactor 32 may be adjusted by means of heating units 40, 42, 44. Alternatively, the temperature of reactor 32 may be adjusted by moving reactor 32 with respect to heating units 40, 42, 44.

By providing a first metal (e.g., Ga) in reagent delivery chamber 38, and a metallo-organic compound comprising a second metal (e.g., In, Al) in source 52, alloys having various compositions of III–V compounds may be readily deposited on substrate 14. Furthermore, a dopant source, in the form of a bubbler, evaporative or sublimation source, or in the form of added gas component to the carrier gas stream, or in the form of a dilute pre-mixed mixture of dopant gas and carrier gas, may be introduced via the reactor inlet 34 during HVPE growth steps, in order to form doped III–V nitride layers. A III–V nitride layer, such as GaN, may also be doped by including a dopant source along with the liquid metal supply within the reagent delivery chamber 38 or by providing a separate dopant delivery system in communication with the reactor chamber through a separate dopant inlet, which is not integrated with the metal reagent delivery chamber or the reactor chamber inlet as shown on FIG. 4.

System 30 of the invention, is useful inter alia, for deposition of an epitaxial layer (e.g., of Gan or an alloy thereof) on substrates that are normally destroyed by HVPE but are stable under MOCVD growth conditions. Examples of HVPE-sensitive substrates are silicon, and patterned substrates. In this case, a protective layer may first be formed in reactor 32 via MOCVD. Thereafter, the deposition mode of system 30 may be switched, either wholly or in part, to HVPE mode. This allows the faster and less costly HVPE mode to be used for epitaxial growth on a HVPE-sensitive substrate. As was noted hereinabove, system 30 may be switched from MOCVD mode to HVPE mode, and vice versa, without interruption of deposition or removal of the sample from reactor 32.

System 30 may include a plurality of different heating units. Thus, system 30 may include a first heating unit 40, a second heating unit 42, and a third heating unit 44. First, second, and third heating units 40, 42, 44 may each be in the form of a furnace, one or more lamps, or a plurality of radio frequency or micro-wave heater induction coils. First, second, and third heating units 40, 42, 44 may be located at different positions, both laterally and longitudinally with respect to reactor 32. Then, by moving reactor 32 with respect to first, second, and third heating units 40, 42, 44 the temperature of the reactor may be adjusted according to the particular mode of deposition to be performed. Manipulation (e.g., movement) and/or adjustment of heating units 40, 42, 44 allows for fine tuning of deposition within reactor 32. Longitudinal movement of reactor 32 is indicated in FIG. 3 by double-headed arrow 32'. Alternatively, one or more of first, second, and third heating units 40, 42, 44 may themselves be moved, independently of each other, with respect to reactor 32 in order to effect-temperature changes within reactor 32. Also, an internal heating unit 31 that is positioned within the reactor 32, may be used to control the temperature. The internal heating unit 31 is preferably positioned within the substrate platform 11 and controls the surface temperature of the substrate platform 11 and the attached substrate 14.

Figure 4:
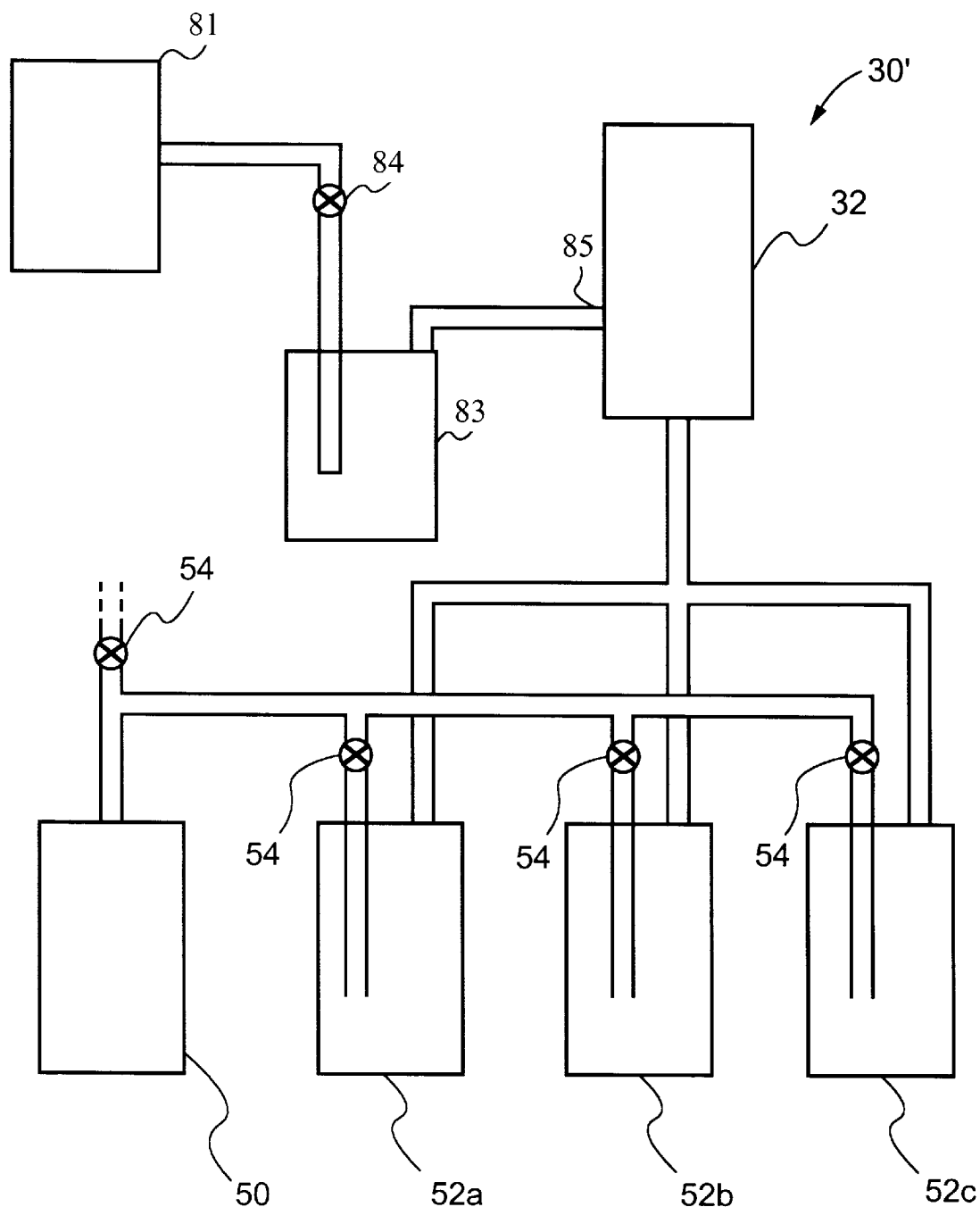
FIG. 4 schematically represents multiple organo-metallic sources and a dopant source for use in conjunction with a deposition system, according to one embodiment of the invention.

FIG. 4 schematically represents part of a deposition system 30', according to another embodiment of the invention. System 30' is analogous to system 30 (FIG. 3), except that the former includes a plurality of metallo-organic sources 52a, 52b, 52c. Although three such sources are shown in FIG. 4, other numbers are within the scope of the invention. Each metallo-organic source 52a, 52b, 52c is connected to carrier gas source 50 for supplying carrier gas to metallo-organic sources 52a, 52b, 52c. The supply of carrier gas to each of sources 52a, 52b, 52c is controlled by a valve, e.g., 54. Each metallo-organic source 52a, 52b, 52c is further coupled to reactor 32 for supplying metallo-organic vapor to reactor 32. Each metallo-organic source 52a, 52b, 52c may contain a different metallo-organic composition. For, example, sources 52a, 52b, 52c may contain a Al-, an In-, and a Ga-containing compound, respectively. Alternatively, sources 52a, 52b, 52c may contain an Al-, In-, or Ga-containing compound with or without various dopants.

Again referring to FIG. 4, the reactor chamber 32, may be equipped with a separate inlet 85 for delivering a dopant source 83 to the reactor chamber 32 during deposition processes. In a particular embodiment of the current invention the dopant source 83, is delivered to the reactor chamber 32 via a bubbler. A dopant carrier gas 81 is bubbled through a dopant reagent or source 83 with a flow rate that is controlled by a valve 84, in similar fashion to that which is described above for delivering metallo-organic sources to the reactor chamber 32. Suitable dopant reagents include organo-nitrogen, organo-arsenic and organo-phosphorus.

By adjusting valves 54 and 84, the relative amount of each metallo-organic composition and dopant supplied to reactor 32 may be precisely controlled over time. In this way, layers of AlN, InN, GaN, and their alloys (e.g., AlGaN, InAlN, InAlGaN) with varying thickness, varying compositions and varying dopant contents may be grown by MOCVD, or by combined MOCVD/HVPE, on a single substrate. The ability of system 30' to operate in HVPE mode, MOCVD mode, or in joint HVPE/MOCVD mode, while providing a plurality of metallo-organic sources 52a–c, allows greater control over the composition and thickness of various III–V nitride layers to be formed according to the invention. Thus, it can be seen that systems 30 and 30' are highly versatile in their operation, and allow for the formation of a huge array of semiconductor layers and heterostructures using a single apparatus.

Figure 5A:
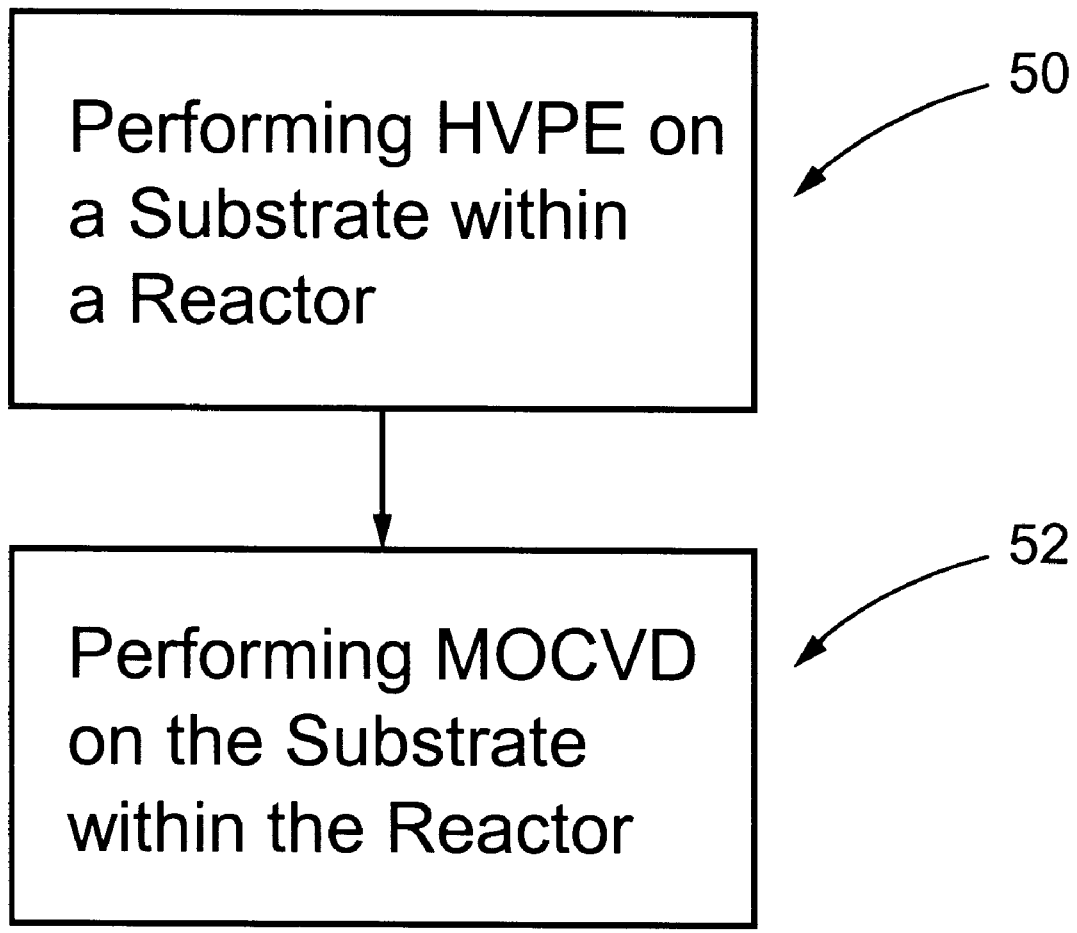
FIG. 5A schematically represents a series of steps involved in a method of hybrid deposition, according to the invention.

FIG. 5A schematically represents a series of steps involved in a hybrid deposition method, according to the invention, in which step 50 involves performing HVPE in a reactor of a hybrid deposition system to provide a semiconductor layer or III–V compound on a substrate. By "hybrid deposition system" is meant a system adapted for deposition by at least two distinct modes (e.g., MOCVD and HVPE), in which the two distinct modes may be performed either consecutively or simultaneously in the same reactor. Preferably, the substrate or sample is not removed from the reactor while the mode of operation of the deposition system is changed. The sample may be a non-native substrate, such as silicon or sapphire.

Step 52 involves performing MOCVD in the same reactor of the hybrid deposition system as used for step 50. Step 52 may be performed before, after, or at the same time as step 50, depending on the particular application of the sample, the nature of the material to be deposited by HVPE and MOCVD, the nature of the substrate, etc.

Figure 5B:
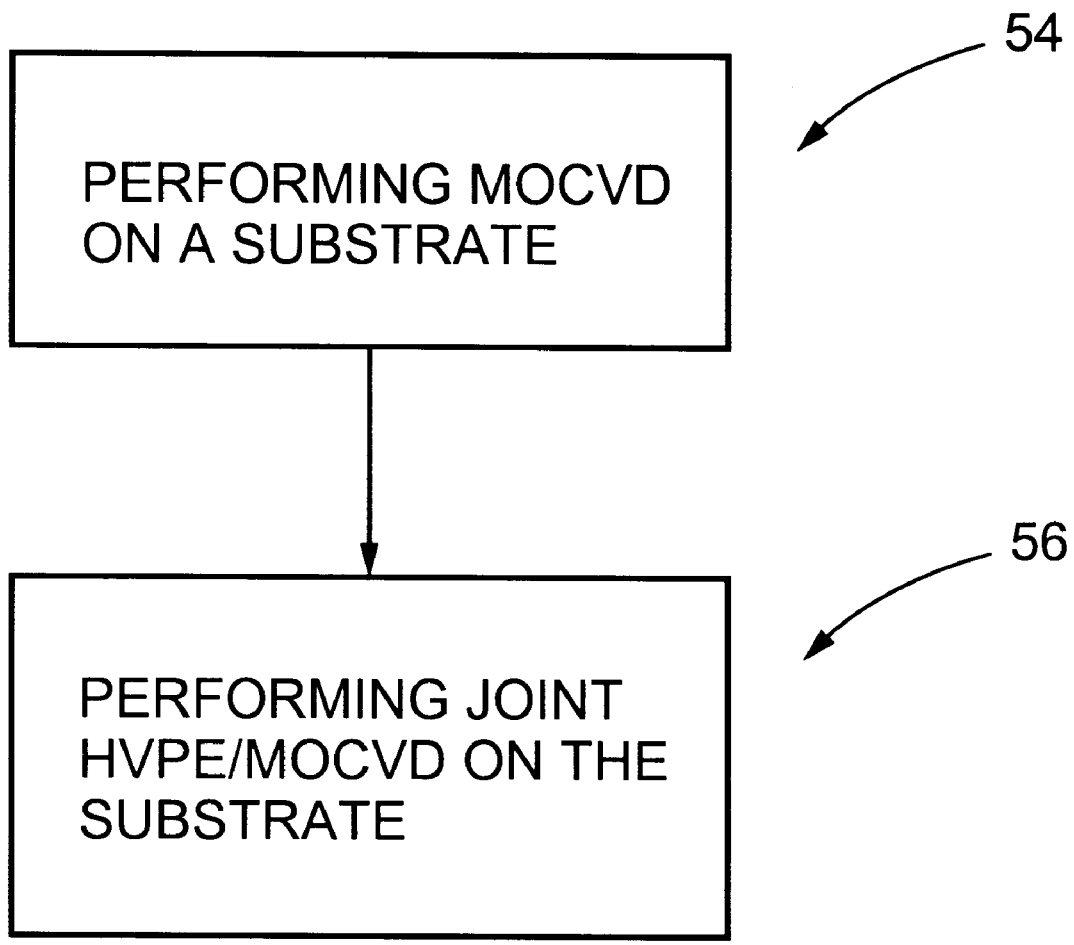
FIG. 5B schematically represents a series of steps involved in a method of hybrid deposition, according to another embodiment of the invention.

FIG. 5B schematically represents a series of steps involved in a method of hybrid deposition, according to another embodiment of the invention, in which step 54 involves performing MOCVD on a substrate. The substrate is arranged within a reactor of a hybrid deposition system. The substrate may be a non-native substrate, such as silicon or sapphire, and may be a patterned substrate. A layer of a semiconductor, such as a III–V nitride, may be deposited on the substrate to any desired thickness, but is preferably in the range 1.0 nanometer to 5.0 micron. According to one embodiment of the invention, a relatively thin protective layer of, for example, AlN may be deposited by MOCVD on a HVPE-sensitive substrate. Step 54 may be performed, for example, by supplying ammonia gas and vapor from an aluminum-containing organic compound to the reactor housing the substrate.

Step 56 involves performing HVPE in the reactor of the hybrid deposition system while continuing MOCVD deposition. Step 56 may be performed, for example, by supplying a second reagent gas (e.g., GaCl or InCl) to the reactor housing the substrate, together with ammonia gas and vapor from a metallo-organic compound. Step 56 may be performed with no interruption of the deposition initiated in step 54. By combining MOCVD and HVPE deposition simultaneously in step 56, an additional semiconductor layer of any desired thickness and of varying chemical composition may be formed on the layer deposited in step 54.

Figure 6A:
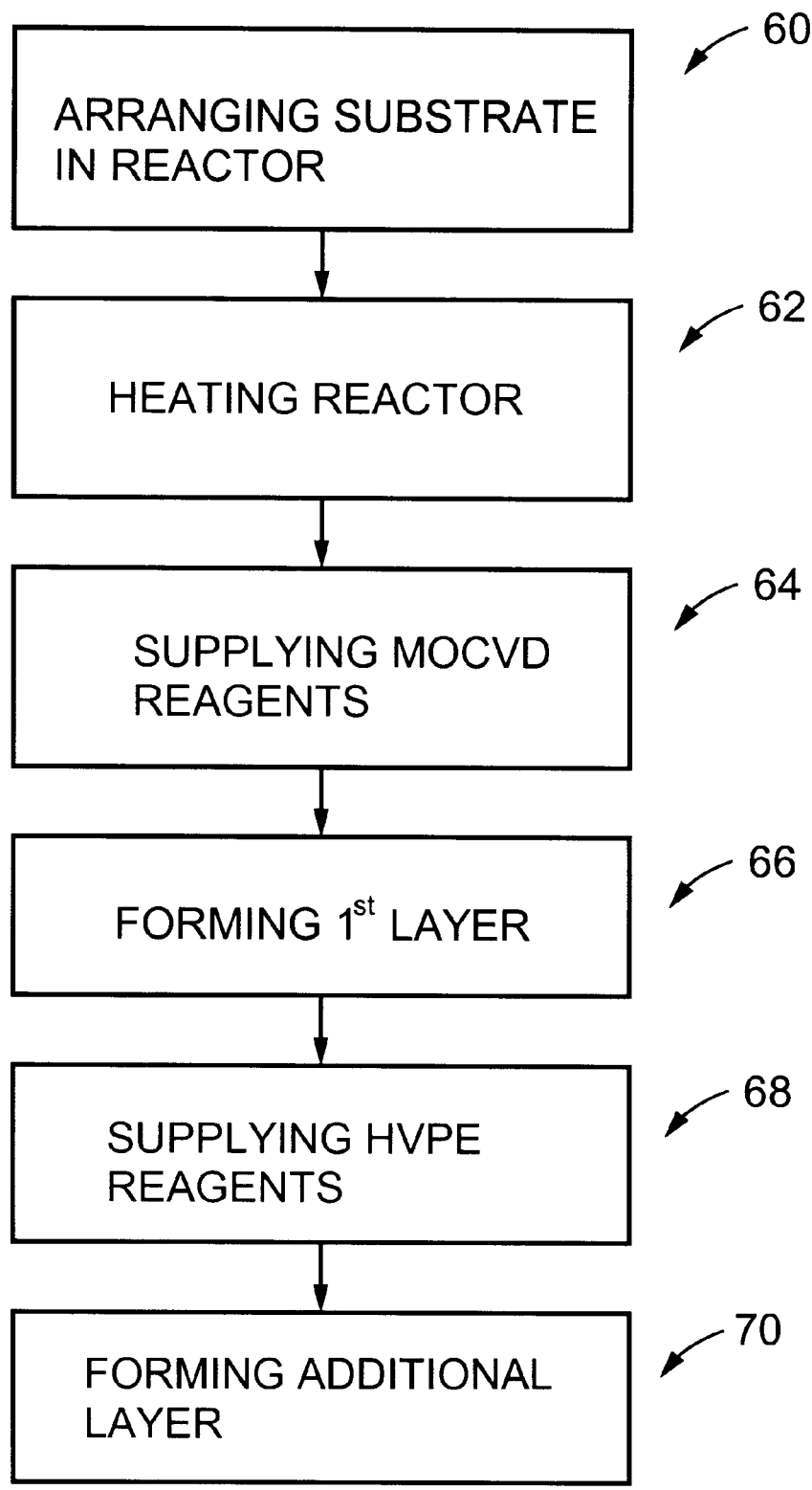
FIG. 6A schematically represents a series of steps involved in a method of hybrid deposition, according to another embodiment of the invention.

FIG. 6A schematically represents a series of steps involved in a method of hybrid deposition, according to another embodiment of the invention, in which step 60 involves arranging a substrate in a reactor of a hybrid deposition system. The hybrid deposition system may be any of the embodiments of a hybrid deposition system described hereinabove, or variants thereof as may be apparent to the skilled artisan. Step 62 involves heating the reactor. The reactor may be heated to any desired temperature by means of at least one heating unit. Heating units may be in the form of, e.g., one or more furnaces, at least one lamp, a plurality of rf heater coils, or an internal heating unit. The desired growth temperature may be determined by factors such as the mode of deposition, the materials to be deposited, the nature of the substrate, etc.

Step 64 involves supplying, to the reactor, suitable reagents for performing MOCVD on the substrate. Reagents for MOCVD together with techniques suitable for supplying them to the reactor of a hybrid deposition system have been described hereinabove. Step 66 involves forming a first layer on the substrate by MOCVD. The first layer deposited on the substrate may be a III–V nitride, such as AlN, GaN, InN, or an alloy thereof. After step 66, step 68 involves supplying HVPE reagents to the reactor of the hybrid deposition system, generally according to techniques and processes described hereinabove. Prior to step 68, the reactor temperature may be adjusted, as deemed appropriate for deposition of at least one additional layer (step 70) on the first layer. The temperature of the reactor may be adjusted by means of the at least one heating unit, or by, for example, changing the location of the reactor with respect to the at least one heating unit.

Step 70 involves forming at least one additional layer on the first layer. The at least one additional layer may be formed by HVPE alone or by a combination of HVPE and MOCVD. The at least one additional layer may be a III–V nitride or an alloy of two or more III–V nitrides. According to a currently preferred embodiment of the invention, the at least one additional layer includes GaN and/or an alloy of GaN.

Figure 6B:
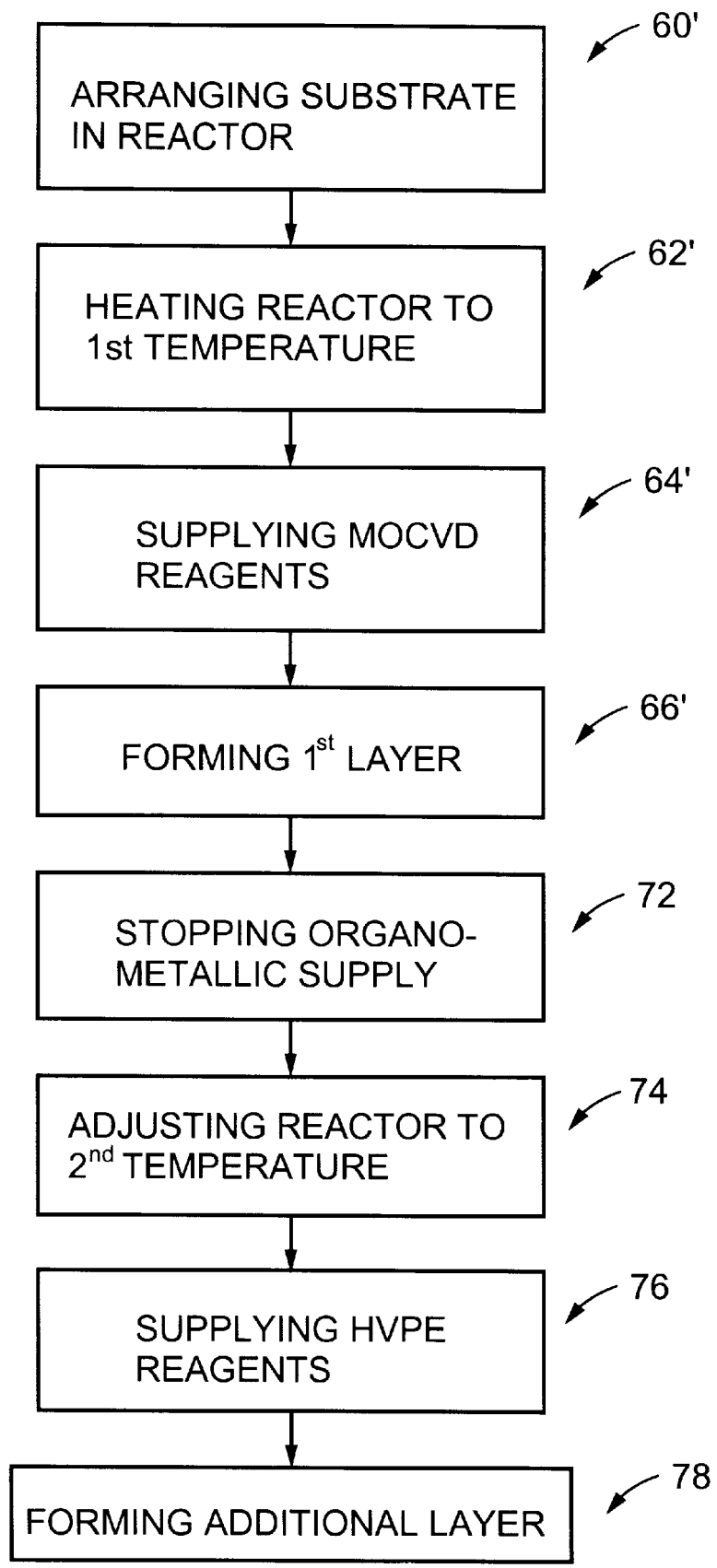
FIG. 6B schematically represents a series of steps involved in a method of hybrid deposition, according to another embodiment of the invention.

FIG. 6B schematically represents a series of steps involved in a method of hybrid deposition, according to another embodiment of the invention, in which step 60' is analogous to step 60 (FIG. 6A). Step 62' involves heating the reactor to a first growth temperature, generally as described hereinabove for step 62 (FIG. 6A). The first growth temperature of step 62' may be selected to fit deposition of a particular material, e.g., AlN, by a particular technique, such as MOCVD. Steps 64' and 66' are analogous to steps 64 and 66 (FIG. 6A). Step 72 involves stopping the supply to the reactor of vapor from the metallo-organic reagent. Optional step 74 involves adjusting the reactor to a second growth temperature, as appropriate for deposition of a particular material, e.g., GaN, by HVPE (step 78). The reactor may be adjusted to the second growth temperature generally as described for step 62 (FIG. 6A). Step 76 involves supplying reagents for HVPE, e.g., ammonia and a chloride of Ga or In, generally as described hereinabove. Step 78 involves forming at least one additional layer, e.(g., of a III–V nitride, on the first layer (step 66'). According to the embodiment of FIG. 6B, the at least one additional layer formed in step 78 may be formed solely by HVPE.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A hybrid deposition system, comprising:
   a) a reactor chamber;
   b) a reagent delivery chamber having a reagent delivery chamber inlet, said reagent delivery chamber coupled to said reactor chamber;
   c) at least one heating unit for supplying heat to said reactor chamber; and
   d) at least one metalorganic source coupled to said reactor chamber; and
   e) wherein said system is operable in HVPE mode, in MOCVD mode, and in both HVPE mode and MOCVD mode simultaneously.

2. The hybrid deposition system of claim 1, wherein said at least one heating unit external to said reactor chamber and said heating unit is selected from the group consisting of a furnace, a lamp, an rf heater coil and a resistive heating element.

3. The hybrid deposition system of claim 1, wherein said at least one heating unit is internal to said reactor chamber and said heating unit is selected from the group consisting of a lamp, an rf heater coil and a resistive heating element.

4. The hybrid deposition system of claim 1, wherein said hybrid deposition system comprising at least one heating unit comprises a plurality of heating units with at least one of said plurality of heating units being an internal heating unit that is internal to said reactor chamber and at least one of said plurality of heating units that is an external heating unit which is external to said reactor chamber and, wherein each of said plurality of heating units selected from the group consisting of an external furnace, a lamp, an rf heater coil and a resistive heating element.

5. The hybrid deposition system of claim 1, further comprising a substrate platform positioned within said reactor chamber for supporting a substrate and, wherein said at least one internal heating unit is housed within said substrate platform unit.

6. The hybrid deposition system of claim 1, wherein said at least one heating unit comprises a furnace, at least one lamp, and at least one rf heater coil.

7. The hybrid deposition system of claim 1, further comprising a first reagent gas source and a precursor gas source.

8. The hybrid deposition system claim 1, further comprising a carrier gas manifold, where at least one outlet of said manifold is connected to said at least one metalorganic source.

9. The hybrid deposition system of claim 8, wherein said carrier gas manifold is coupled to said reagent delivery chamber via said reagent delivery chamber inlet; and wherein said carrier gas manifold is coupled separately to said at least one metalorganic source.

10. The hybrid deposition system of claim 1, wherein said at least one metalorganic source is a gallium-, indium-, and/or aluminum-containing organic compound.

11. The hybrid deposition system of claim 10, wherein said metalorganic source includes at least one dopant.

12. The hybrid deposition system of claim 1, further comprising a dopant delivery system for delivering a dopant to said reactor chamber during a deposition processes, said dopant delivery system comprising:
 a) a dopant carrier gas source supplying a carrier gas to a dopant source;
 b) a dopant source coupled to a said reactor chamber.

13. The hybrid deposition system of claim 12, wherein said dopant delivery system is coupled to said reactor chamber through a reactor chamber inlet.

14. The hybrid deposition system of claim 12, wherein said dopant delivery system is coupled to said reactor chamber through said reagent delivery chamber.

15. The hybrid deposition system of claim 12, wherein said dopant source is a bubbler containing a dopant, wherein said dopant is delivered in to said reactor chamber by bubbling said dopant carrier gas source through said dopant.

16. The hybrid deposition system of claim 1, wherein said reactor chamber is moveable with respect to said at least one heating unit.

17. The hybrid deposition system of claim 1, wherein said at least one heating unit is moveable with respect to said reactor chamber.

18. The hybrid deposition system of claim 1, wherein said at least one metalorganic source comprises a plurality of bubblers each containing an organic compound of gallium, indium and/or aluminum.

19. The hybrid deposition system of claim 1, wherein said precursor gas comprises HCl, and said reagent delivery chamber contains liquid gallium, liquid indium, or liquid aluminum.

20. A hybrid deposition method, comprising the steps of:
 a) performing MOCVD on a substrate within a reactor chamber; and
 b) performing hydride vapor-phase epitaxy on said substrate within said reactor chamber without removing the substrate from the reactor chamber between steps a) and b); and
 c) wherein the hydride vapor phase epitaxy comprises the step of passing a group V-bearing reagent gas into said reactor chamber and passing a second reagent gas into said reactor chamber, wherein said second reagent gas is generated by passing HCl into a reagent delivery chamber, wherein said reagent delivery chamber contains a metal selected from the group consisting of liquid gallium, liquid indium, and/or liquid aluminum.

21. The method of claim 20, wherein said step b) is carried out prior to said step a) without removing the substrate from the reactor chamber between steps b) and a).

22. The method of claim 20, wherein said step b) is carried out prior to said step a), and thereafter while continuing said step b), beginning said step a).

23. The method of claim 20, further comprising the steps of:
 c) prior to said steps a) and b), heating said substrate to a first growth temperature; and
 d) between steps a) and b), adjusting the substrate temperature to a second growth temperature.

24. The method of claim 23, wherein said step d comprises changing the relative location of said reactor chamber with respect to at least one heating unit.

25. The method of claim 20, further comprising the step of:
 between steps a) and b), flowing a group V-bearing reagent gas into said reactor chamber.

26. The method of claim 20, wherein said steps a) and b) individually form III–V nitride layers.

27. The method of claim 26, wherein said III–V nitride layers have different compositions.

28. The method of claim 26, wherein at least one of said III–V nitride layers includes a dopant.

29. The method of claim 26, wherein one or more of said III–V nitride layer comprises GaN, InN and/or AlN.

30. The method of claim 20, wherein said group V-bearing reagent gas comprises ammonia, and said second reagent gas comprises GaCl, InCl, and/or AlCl.

31. The method of claim 20, wherein said MOCVD step a) comprises the steps of:
 passing a group V-bearing reagent gas into said reactor chamber; and
 passing a second reagent gas into said reactor chamber, wherein said second reagent gas includes a metalorganic vapor.

32. The method of claim 31, wherein said metalorganic vapor consists of one or more from the group TMGa, TEGa, TMA, TEA, TMIn.

33. The method of claim 20 where the reaction chamber contains a heater system designed for step a) and a heater system designed for step b).

34. The method of claim 20, wherein while continuing said step a), beginning said step b).

35. A method of forming a semiconductor layer, comprising the steps of:
 a) arranging a substrate within a reactor chamber;
 b) heating said substrate to a first growth temperature;
 c) supplying a first reagent gas and a metalorganic vapor to said reactor chamber to provide, by MOCVD, a first III–V nitride layer on said substrate;
 d after said step c), stopping said supply of metalorganic vapor to said reactor chamber; and
 e) in situ, supplying said first reagent gas to said reactor chamber and supplying a second reagent gas to said reactor chamber to provide at least one additional III–V nitride layer on said first III–V nitride layer.

36. The method of claim 35, wherein said first reagent gas comprises ammonia, and said second reagent gas comprises GaCl, InCl, and/or AlCl, and said second reagent gas is produced by passing HCl over a metal.

37. The method of claim 35, wherein said metalorganic vapor comprises a Ga-, In-, and/or Al-containing compound, and said first reagent gas comprises ammonia.

38. The method of claim 35, where in after step d) and before step e), adjusting the temperature and/or heating method of the substrate.

39. A method of forming a semiconductor layer, comprising the steps of:
   a) arranging a substrate within a reactor chamber;
   b) heating said substrate to a first growth temperature;
   c) supplying a first reagent gas and a metalorganic vapor to said reactor chamber to provide, by MOCVD, a first III–V nitride layer on said substrate; and
   d) while continuing to supply said first reagent gas to said reactor chamber, supplying a second reagent gas to said reactor chamber to provide at least one additional III–V nitride layer on said first III–V nitride layer, wherein said second reagent gas is produced by passing HCl over a metal chosen from the group consisting of gallium, indium, aluminum, and their alloys.

40. The method of claim 39, wherein said first III–V nitride layer comprises AlN, and said at least one additional III–V nitride layer comprises GaN.

41. A hybrid deposition apparatus, comprising:
   a) means for performing hydride vapor-phase epitaxy on a substrate within a reactor chamber, wherein for the hydride vapor-phase epitaxy a precursor gas is passed over a metal; and
   b) means for performing MOCVD on said substrate within said reactor chamber, wherein hydride vapor-phase epitaxy and MOCVD may be performed on the substrate in the reactor chamber without removing the substrate from the reactor chamber.

* * * * *